(12) United States Patent
Sinha

(10) Patent No.: US 8,871,120 B2
(45) Date of Patent: Oct. 28, 2014

(54) COMPOSITIONS OF MATTER, AND METHODS OF REMOVING SILICON DIOXIDE

(71) Applicant: Micron Technology, Inc., Boise, ID (US)

(72) Inventor: Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/046,832

(22) Filed: Oct. 4, 2013

(65) Prior Publication Data

US 2014/0037527 A1   Feb. 6, 2014

Related U.S. Application Data

(62) Division of application No. 13/531,241, filed on Jun. 22, 2012, now Pat. No. 8,580,158, which is a division of application No. 12/114,174, filed on May 2, 2008, now Pat. No. 8,226,840.

(51) Int. Cl.
   *H01B 1/02* (2006.01)
   *H01L 21/311* (2006.01)
   *H01L 21/308* (2006.01)

(52) U.S. Cl.
   CPC ...... *H01L 21/3081* (2013.01); *H01L 21/31111* (2013.01)
   USPC .............. 252/521.3; 216/57; 216/63; 216/79; 438/186; 438/559; 438/723; 438/738

(58) Field of Classification Search
   USPC .............. 252/521.3; 216/57, 63, 79; 438/723, 438/738, 186, 559
   See application file for complete search history.

(56) References Cited

U.S. PATENT DOCUMENTS

| 3,354,008 A | * | 11/1967 | Statham et al. | 438/559 |
| 3,671,437 A | | 6/1972 | Pless | |
| 3,761,328 A | * | 9/1973 | Toshio et al. | 438/186 |
| 4,465,552 A | | 8/1984 | Bobbio et al. | |
| 4,680,048 A | * | 7/1987 | Motoki et al. | 65/17.2 |

(Continued)

FOREIGN PATENT DOCUMENTS

| EP | 0376252 B1 | 7/1990 |
| EP | 0658928 A1 | 6/1995 |
| WO | WO0003424 A1 | 1/2000 |

OTHER PUBLICATIONS

Williams, Kirt R., et al. "Etch Rates for Micromachining Processing" Journal of Microelectromechanical Systems, vol. 5, No. 4, Dec. 1996, pp. 256-269.

(Continued)

*Primary Examiner* — Khanh Tuan Nguyen
(74) *Attorney, Agent, or Firm* — Wells St. John P.S.

(57) ABSTRACT

Some embodiments include methods of removing silicon dioxide in which the silicon dioxide is exposed to a mixture that includes activated hydrogen and at least one primary, secondary, tertiary or quaternary ammonium halide. The mixture may also include one or more of thallium, $BX_3$ and $PQ_3$, where X and Q are halides. Some embodiments include methods of selectively etching undoped silicon dioxide relative to doped silicon dioxide, in which thallium is incorporated into the doped silicon dioxide prior to the etching. Some embodiments include compositions of matter containing silicon dioxide doped with thallium to a concentration of from about 1 weight % to about 10 weight %.

7 Claims, 5 Drawing Sheets

(56) References Cited

U.S. PATENT DOCUMENTS

| | | | |
|---|---|---|---|
| 5,030,319 | A | 7/1991 | Nishino et al. |
| 5,376,233 | A | 12/1994 | Man |
| 5,423,944 | A | 6/1995 | Wong |
| 5,505,816 | A | 4/1996 | Barnes et al. |
| 5,990,019 | A | 11/1999 | Torek et al. |
| 5,990,060 | A | 11/1999 | Ohmi et al. |
| 6,149,828 | A | 11/2000 | Vaartstra |
| 6,329,292 | B1 | 12/2001 | Hung et al. |
| 6,358,325 | B1 | 3/2002 | Andreas |
| 6,486,070 | B1 | 11/2002 | Ho et al. |
| 6,506,321 | B1 * | 1/2003 | Yamashita et al. ......... 252/521.3 |
| 6,524,940 | B2 | 2/2003 | Verhaverbeke et al. |
| 6,774,047 | B2 | 8/2004 | Funabashi |
| 6,794,305 | B2 | 9/2004 | Funabashi |
| 6,890,865 | B2 | 5/2005 | Yin et al. |
| 6,942,811 | B2 | 9/2005 | Patel et al. |
| 7,405,189 | B2 | 7/2008 | Lee |
| 7,628,932 | B2 | 12/2009 | Lee et al. |
| 7,820,067 | B2 | 10/2010 | Li |
| 7,938,911 | B2 | 5/2011 | Zapilko et al. |
| 7,973,388 | B2 | 7/2011 | Lee et al. |
| 2003/0017686 | A1 | 1/2003 | Wada |
| 2003/0022512 | A1 | 1/2003 | Saito et al. |
| 2005/0037617 | A1 | 2/2005 | Magni |
| 2005/0118832 | A1 | 6/2005 | Korzenski et al. |
| 2005/0143270 | A1 | 6/2005 | Wojtczak et al. |
| 2005/0164459 | A1 | 7/2005 | Young |
| 2005/0239282 | A1 | 10/2005 | Chen et al. |
| 2005/0284574 | A1 | 12/2005 | Tanaka et al. |
| 2005/0287749 | A1 | 12/2005 | Li |
| 2006/0105573 | A1 | 5/2006 | Mahalingam et al. |
| 2006/0254612 | A1 | 11/2006 | Farrar |
| 2007/0020944 | A1 | 1/2007 | Chae et al. |
| 2007/0051470 | A1 | 3/2007 | Iwakoshi et al. |
| 2007/0224822 | A1 | 9/2007 | Li |
| 2007/0262048 | A1 | 11/2007 | Rana et al. |
| 2007/0278183 | A1 | 12/2007 | Lee |
| 2007/0281493 | A1 | 12/2007 | Fucsko et al. |
| 2008/0038896 | A1 | 2/2008 | Rana |
| 2008/0057724 | A1 | 3/2008 | Kiehlbauch et al. |
| 2008/0096390 | A1 | 4/2008 | Li |
| 2009/0007940 | A1 | 1/2009 | Zapilko et al. |
| 2010/0013061 | A1 | 1/2010 | Lee et al. |
| 2010/0216315 | A1 | 8/2010 | Yaguchi et al. |
| 2011/0260298 | A1 | 10/2011 | Lee et al. |

OTHER PUBLICATIONS

Nobuhiro Miki, et al. "Gas-Phase Selective Etching of Native Oxide" IEEE Transactions on Electron Devices, vol. 37, No. 1, Jan. 1990, pp. 107-115.

Williams, Kirt R. et al.. "Etch Rates for Micromachining Processing—Part II" Journal of Microelectromechanical Systems, vol. 12, No. 6, Dec. 2003, pp. 761-778.

Hiroki, et al. "Dry Cleaning Technology for Removal of Silicon Native Oxide Employing Hot NH3/NF3 Exposure" The Japan Society of Applied Physics vol. 41, Part 2, No. 8, Aug. 2002, pp. 5349-5358.

Kang, Tsung-Kuei, et al. "Selectivity Investigation of HfO2 to Oxide Using Wet Etching" IEEE, May 2004, pp. 87-90.

Graf, W., et al. "Highly Selective Oxide to Nitride Etch Processes on BPSG/Nitride/Oxide Structures in a MERIE Etcher" IEEE/SEMI Advanced Semiconductor Manufacturing Conference, Aug. 1998, pp. 314-319.

Gaboriau, F., et al. "Selective and deep etching of SiO/sub 2/ in high density low pressure fluorocarbon plasmas" website http://ieeexplore.ieee.org/xpl/absprintf.jsp?arnumber=1030545&page=FREE, printed Apr. 28, 2008.

* cited by examiner

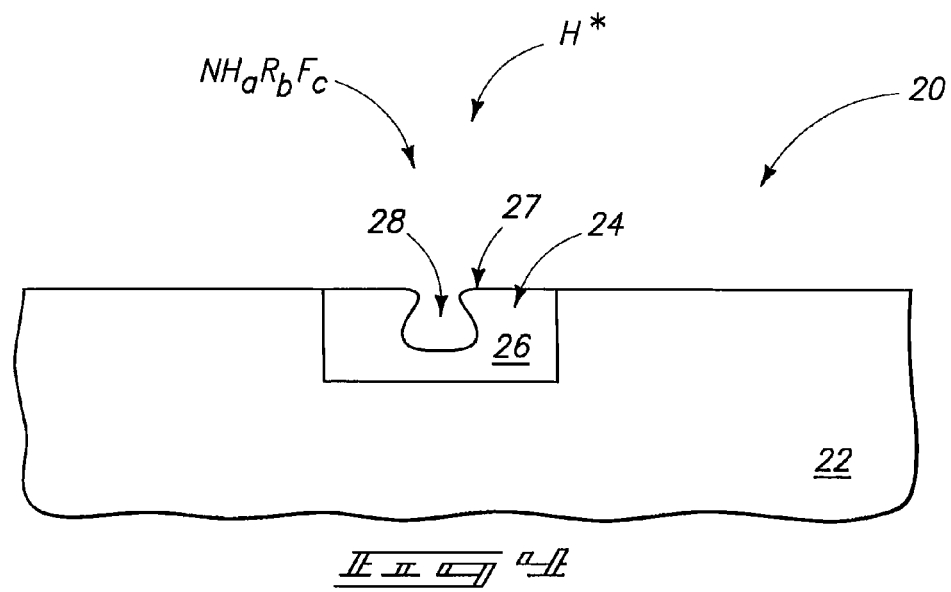
_Fig. 4_
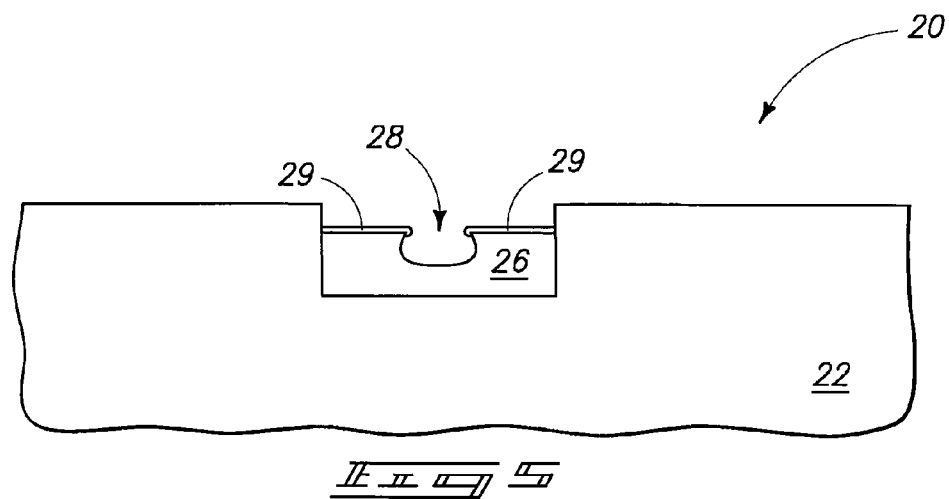
_Fig. 5_
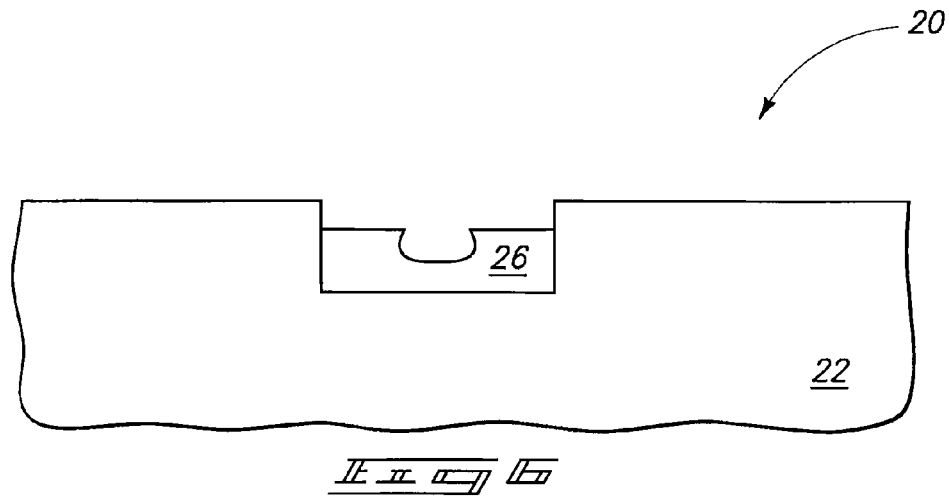
_Fig. 6_

COMPOSITIONS OF MATTER, AND METHODS OF REMOVING SILICON DIOXIDE

RELATED PATENT DATA

This patent resulted from a divisional of U.S. patent application Ser. No. 13/531,241, which was filed Jun. 22, 2012, and which is hereby incorporated herein by reference; which resulted from a divisional of U.S. patent application Ser. No. 12/114,174, which was filed May 2, 2008, which issued U.S. Pat. No. 8,226,840, and which is hereby incorporated herein by reference.

TECHNICAL FIELD

Compositions of matter, and methods of removing silicon dioxide.

BACKGROUND

Silicon dioxide is frequently utilized during integrated circuit fabrication. The silicon dioxide may be utilized for its insulative properties. Additionally, or alternatively, the silicon dioxide may be utilized for its etch properties in that it can be a sacrificial material that may be removed selectively relative to other materials, or may be a protective material which is selectively retained while other materials are removed.

In some applications it is desired to remove only a portion of a silicon dioxide layer, while leaving the remainder of the silicon dioxide layer. For instance, it may be desired to strip the upper surface of a silicon dioxide layer to remove contaminants or possible non-homogeneities prior to utilizing the silicon dioxide layer as a gate dielectric.

As another example, it may be desired to form silicon dioxide within a trench to fabricate a trenched isolation region. The silicon dioxide may be initially formed to fill, or even overfill the trench; and it may be desired to remove some of silicon dioxide so that the silicon dioxide ultimately is recessed to beneath an uppermost level of the trench.

A method for removing a portion of a silicon dioxide layer is to utilize a diffusion-limited etch. Such etch will stop after some of the silicon dioxide layer is removed, and before an entirety of the silicon dioxide layer is removed. An example diffusion-limited etch is described with reference to FIGS. 1-3.

FIG. 1 shows a portion of a semiconductor construction 10. The construction includes a semiconductor substrate (or base) 12, and a layer 14 over the substrate.

Substrate 12 may comprise, consist essentially of, or consist of, for example, monocrystalline silicon lightly-doped with background p-type dopant. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Although semiconductor substrate 12 is shown to be homogeneous, in some applications the substrate may comprise one or more electrically insulative materials, electrically conductive materials, and/or semiconductive materials associated with integrated circuit fabrication.

Layer 14 may comprise, consist essentially of, or consist of silicon dioxide.

Layer 14 is exposed to an etchant comprising $NH_xF_y$, and H*, where "x" and "y" are integers greater than or equal to 1, and H* is an activated form of hydrogen. The activated form of hydrogen may result from, for example, flowing a hydrogen-containing species (for instance, $NH_3$) through a plasma.

The etchant removes silicon dioxide from layer 14, but in the process of such removal, an ammonium fluorosilicate by-product is formed. The ammonium fluorosilicate by-product eventually creates a cap across layer 14. The ammonium fluorosilicate cap is impermeable to the etchant, and accordingly impedes further diffusion of the etchant to layer 14. Such prevents further etching of layer 14. The self-limiting nature of the etch restricts the amount of silicon dioxide removed by the etchant Accordingly, the etchant removes only a thin portion from across exposed surfaces of the silicon dioxide. In some applications, the etchant may strip less than or equal to about 5 nanometers from exposed surfaces of the silicon dioxide.

FIG. 2 shows construction 10 after removal of some of layer 14, and after formation of the ammonium fluorosilicate $(NH_4)_2SiF_6$ cap 16 over the remaining portion of layer 14.

In subsequent processing, the ammonium fluorosilicate cap may be removed. Such removal may be accomplished by, for example, heating construction 10 to a temperature above 100° C. to volatilize the ammonium fluorosilicate and/or by utilizing an etch selective for ammonium fluorosilicate relative to the underlying silicon dioxide. FIG. 3 shows construction 10 at a processing stage after removal of the ammonium fluorosilicate cap 16 (FIG. 2).

The technology of FIGS. 1-3 is useful for cleaning and recessing silicon dioxide. However, there are some applications where the technology leads to less than satisfactory results. For instance, the technology is not particularly selective for undoped silicon dioxide relative to doped silicon dioxide (with doped silicon dioxide being, for example, fluorosilicate glass, borophosphosilicate glass, and phosphosilicate glass), and there are applications in which such selectivity would be desired. As another example, the etching technology may be too aggressive during applications in which it is desired to recess silicon dioxide within a trench or other opening. The silicon dioxide within such openings may have keyholes or seams extending therein, and the etch may expand such keyholes and seams to produce undesired results.

It would be desirable to develop improved etch technologies for removing silicon dioxide.

BRIEF DESCRIPTION OF THE DRAWINGS

FIGS. 4-6 are diagrammatic, cross-sectional views of a portion of a semiconductor construction shown at various process stages of an embodiment.

DETAILED DESCRIPTION OF THE ILLUSTRATED EMBODIMENTS

Figure 1:
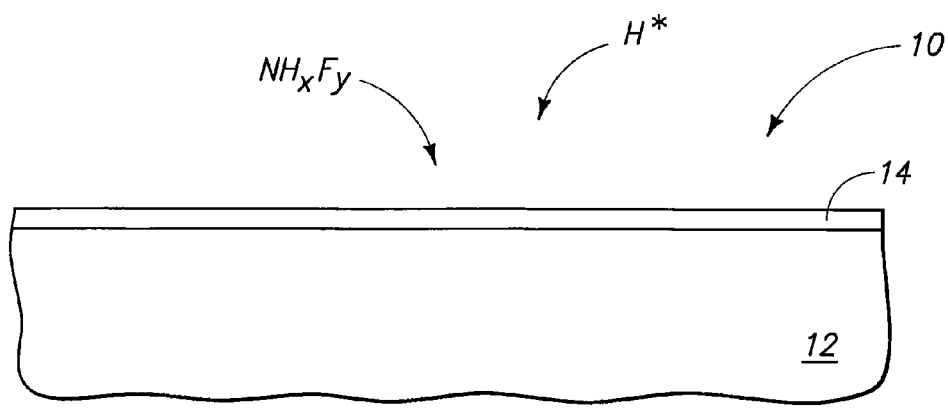
FIGS. 1-3 are diagrammatic, cross-sectional views of a portion of a semiconductor construction shown at various stages of a prior art etch sequence.

The invention includes embodiments in which new chemistries are utilized for diffusion-limited etching of silicon dioxide. Some embodiments include incorporation of relatively large components in the etchant so that geometric constraints limit penetration of the etchant into seams, keyholes, and other tight features. Other embodiments which may be additional, or alternative, to the embodiments utilizing large components include incorporation of components into one or both of the etchant and silicon dioxide-containing material to enhance selectivity between doped and undoped silicon dioxide.

An example embodiment process for incorporating large components into an etchant is described with reference to FIGS. 4-6.

FIG. 4 shows a portion of a semiconductor construction 20. The construction includes a semiconductor substrate (or base) 22 having an opening 24 extending therein. The semiconductor substrate 22 may comprise the same compositions discussed above for the substrate 12 of FIG. 1.

The opening 24 may be a trench, and may ultimately be utilized for forming a trenched isolation region.

Electrically insulative material 26 is formed within opening 24. The electrically insulative material is shown to be a single homogeneous composition, but in some embodiments multiple different compositions may be formed within the opening. Regardless, the insulative material includes silicon dioxide, and an exposed surface 27 of the insulative material comprises, consists essentially of, or consists of silicon dioxide. The shown surface 27 extends into a keyhole (or seam) 28. For purposes of the discussion that follows, the entirety of insulative material 26 may be considered to be silicon dioxide in the shown embodiment.

It is desired to recess material 26 within opening 24 utilizing diffusion-limited etching so that only a limited amount of the material 26 is removed. A problem with prior art methods (such as the methods discussed above with reference to FIGS. 1-3) is that the etchants utilized for diffusion-limited removal of silicon dioxide may penetrate into the keyhole and expand the keyhole during the recessing of insulative material 26. The embodiment of FIG. 4 utilizes $NH_aR_bF_c$ in place of the $NH_xF_y$ of the prior art etchant of FIG. 1. The labels "a", "b" and "c" represent integers, with "a" being greater than or equal to 0; and "b" and "c" being greater than or equal to 1. The material $NH_aR_bF_c$ thus represents a primary, secondary, tertiary or quaternary ammonium halide (the halide of $NH_aR_b$ $F_c$ is shown to be fluorine, but in other embodiments other halides may be utilized in addition to, or alternatively to, fluorine). In some embodiments, the etchant may comprise multiple different compositions represented as $NH_aR_bF_c$, and thus may comprise one or more of a primary, secondary, tertiary and quaternary ammonium halide. In some embodiments, the $NH_aR_bF_c$ may include a composition selected from the group consisting of propargylammonium halide, tetraalkylammonium halide, and mixtures thereof.

The embodiment of FIG. 4, like that of FIG. 1, utilizes the activated form of hydrogen (H*); and such activated form of hydrogen may result from, for example, flowing a hydrogen-containing species (for instance, $NH_3$) through a plasma.

As indicated above, in some embodiments the $NH_aR_bF_c$ may have "a" equal to 0, and thus may be $NR_bF_c$. In such embodiments, the etchant may utilize a mixture of $NR_bF_c$ and $NH_3$, with the $NH_3$ being the source of hydrogen.

The etchant may be in any suitable phase, and in some embodiments may correspond to a gaseous mixture.

The relative amounts of $NH_aR_bF_c$ and activated hydrogen in the mixture may be the same as the relative amounts of ammonium fluoride and activated hydrogen in the prior art mixtures, and the etching conducted utilizing $NH_aR_bF_c$ may occur under the same pressure, temperature and other conditions as are used in the prior art methods with ammonium fluoride and activated hydrogen.

FIG. 5 shows construction 20 after removal of some of the silicon dioxide-containing material 26, and after formation of a diffusion-limiting fluorosilicate layer 29 across silicon dioxide-containing material 26. The removal of some of the silicon dioxide-containing material 26 has decreased a height of the material 26 within opening 24 from a first elevational level shown in FIG. 4 to the second elevational level shown in FIG. 5.

The diffusion-limiting fluorosilicate layer only extends across an upper surface of silicon dioxide-containing material 26, and not into keyhole 28 due to the large size of the $NH_aR_bF_c$ precluding such composition from entering the keyhole and creating the fluorosilicate. Thus, etching has not occurred within the keyhole and the prior art problem of blowing out, or extending, a keyhole or seam has been avoided. In order to avoid penetration of the etchant into a keyhole or seam, it can be desired that the only ammonium halides in the etchant are ammonium halides having a substantial amount of steric hindrance, and accordingly to avoid having ammonium fluoride itself ($NH_4F$) in the mixture. Ammonium fluorides that may have desired steric hindrance are quaternary ammonium halides ($NR_4X$, where "R" is an organic group and "X" is a halide). In some embodiments, the quaternary ammonium halides may have two or more "R" groups which are different from one another, and in other embodiments all of the "R" groups in a quaternary ammonium halide may be the same as one another. The "R" groups of the quaternary ammonium fluorides may each contain at least five carbon atoms in some embodiments.

Figure 2:
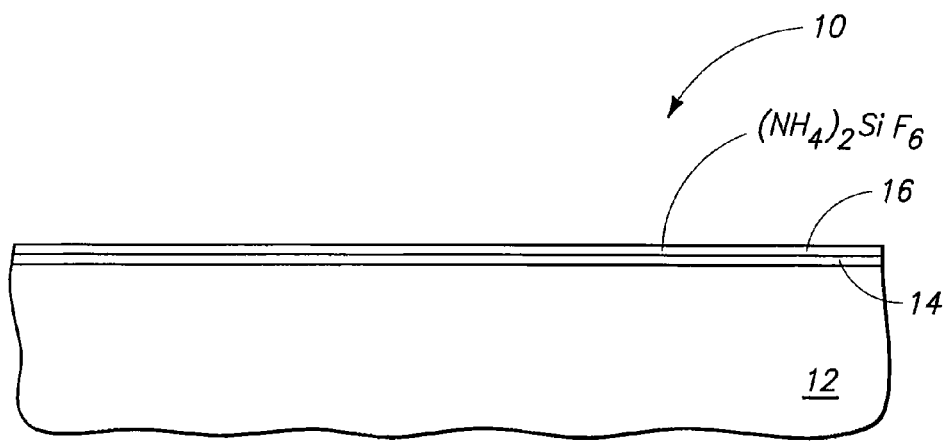
Figure 3:

The layer 29 will be some derivative of ammonium fluorosilicate (for instance, may comprise a quaternary ammonium fluorosilicate), and may be removed utilizing heat and/or etching as discussed above for removal of the fluorosilicate layer 16 of prior art FIG. 2. FIG. 6 shows construction 20 after removal of fluorosilicate layer 29 (FIG. 5).

Another example embodiment process in which it may be useful to incorporate large components into a silicon dioxide etchant is described with reference to FIGS. 7-9.

Figure 7:
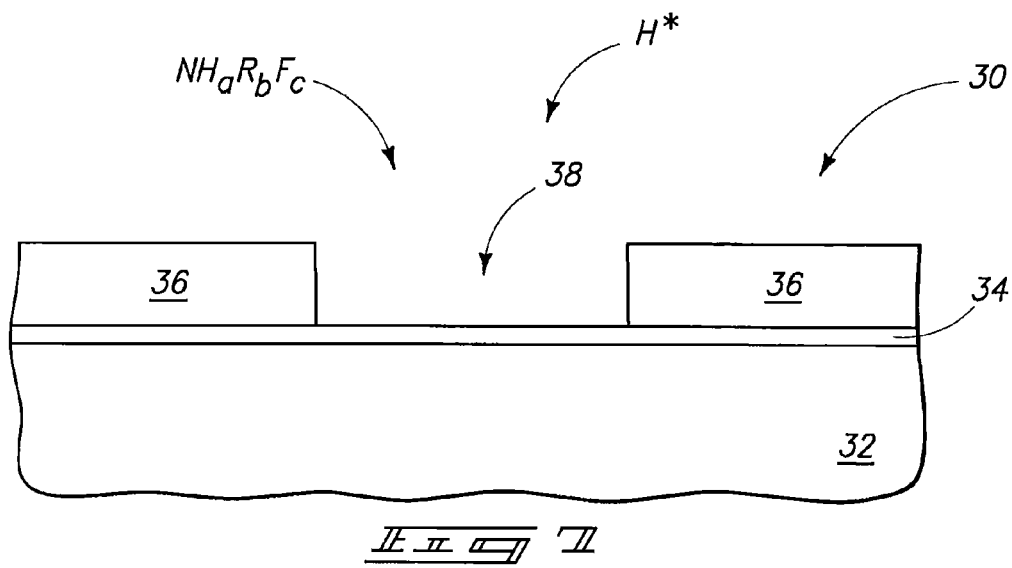
FIGS. 7-9 are diagrammatic, cross-sectional views of a portion of a semiconductor construction shown at various process stages of an embodiment.

FIG. 7 shows a portion of a semiconductor construction 30. The construction includes a semiconductor substrate (or base) 32, a silicon dioxide-containing layer 34 extending across the substrate, and a patterned silicon nitride-containing material 36 over the silicon dioxide-containing layer.

The semiconductor substrate 32 may comprise the same compositions discussed above for the substrate 12 of FIG. 1.

The silicon dioxide-containing layer 34 may comprise, consist essentially of, or consist of silicon dioxide.

The silicon nitride-containing material 36 may comprise, consist essentially of, or consist of silicon nitride. Material 36 may be patterned utilizing, for example, photolithographic processing. Specifically, a photolithographically-patterned photoresist mask (not shown) may be formed over an expanse of material 36, a pattern may be transferred from the photoresist mask to material 36 with one or more suitable etches, and the photoresist mask may then be removed to leave the construction of FIG. 7. The patterned silicon nitride-containing material 36 defines a gap 38 extending therethrough to silicon dioxide-containing layer 34.

The construction of FIG. 7 may be utilized to pattern transistor active regions, and accordingly a portion of silicon dioxide-containing layer 34 within the gap 38 may ultimately be incorporated into a transistor gate dielectric. Prior to such incorporation, an upper surface of the exposed segment of layer 34 is stripped to remove contaminants that may be associated with such upper surface. The stripping may be accomplished utilizing a diffusion-limited etch of the type described above with reference to FIGS. 4-6. Accordingly, construction 30 is shown exposed to $NH_aR_bF_c$ and activated hydrogen.

Figure 8:
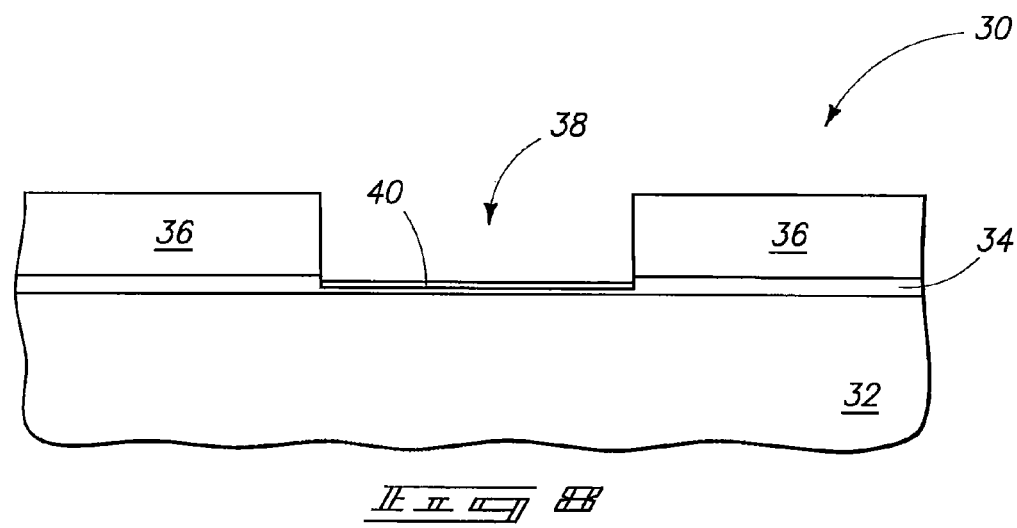

FIG. 8 shows construction 30 after removal of some of the silicon dioxide-containing layer 34, and after formation of a fluorosilicate layer 40 over a remaining portion of the silicon dioxide-containing layer. The fluorosilicate layer limits diffusion of etchant to the remaining portion of silicon dioxide-containing layer 34 within gap 38, and thus stops the etching of layer 34.

A problem with prior art methods for removal of silicon dioxide in applications like those of FIGS. 7 and 8 is that such methods may allow etchant to penetrate under material 36. Such penetration may cause silicon dioxide-containing layer 34 to become recessed under the material 36. In contrast, the etching conditions of the embodiments described herein may utilize etch materials having too much steric hindrance to penetrate under material 36, and accordingly may avoid the prior art problem.

Figure 9:
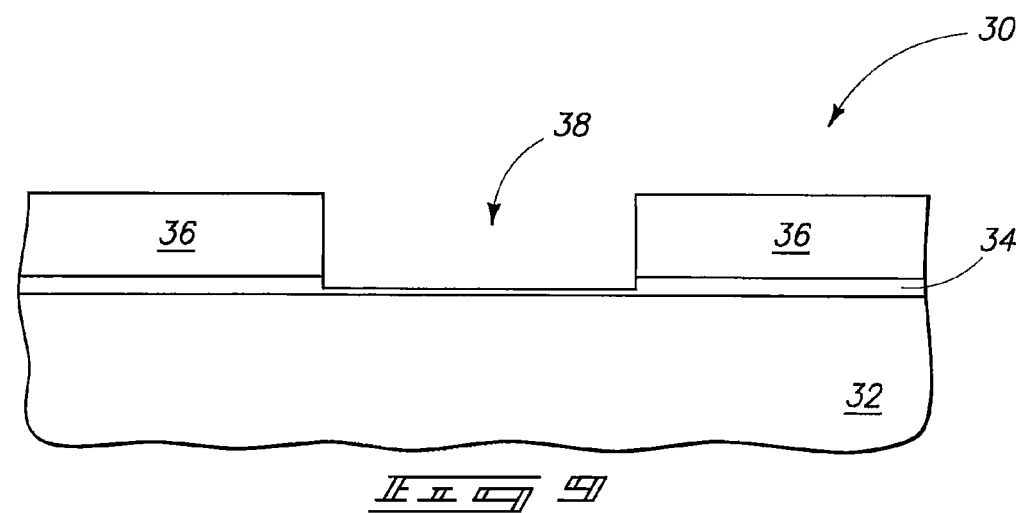

The fluorosilicate layer 40 may be subsequently removed utilizing one or both of thermal treatment an etching, and FIG. 9 shows construction 30 after removal of such fluorosilicate layer.

Figure 10:
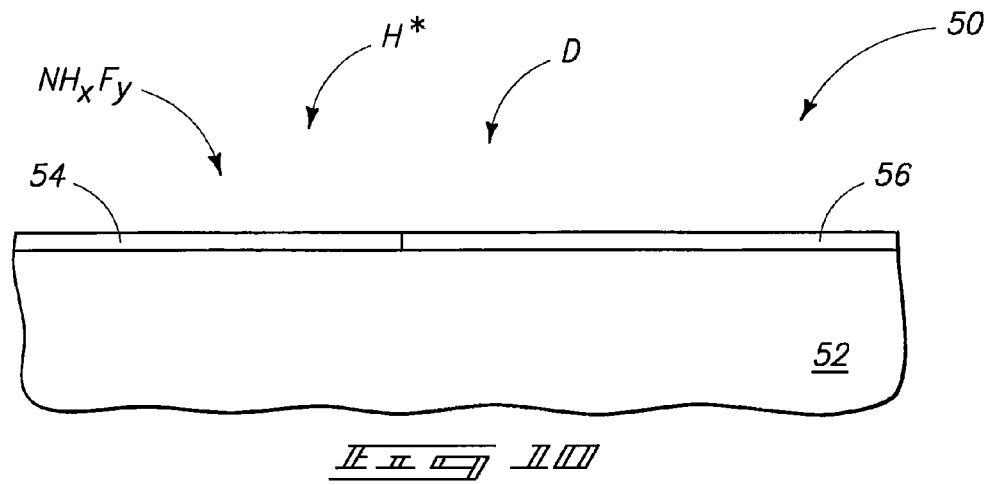
FIGS. 10-12 are diagrammatic, cross-sectional views of a portion of a semiconductor construction shown at various process stages of an embodiment.
Figure 11:
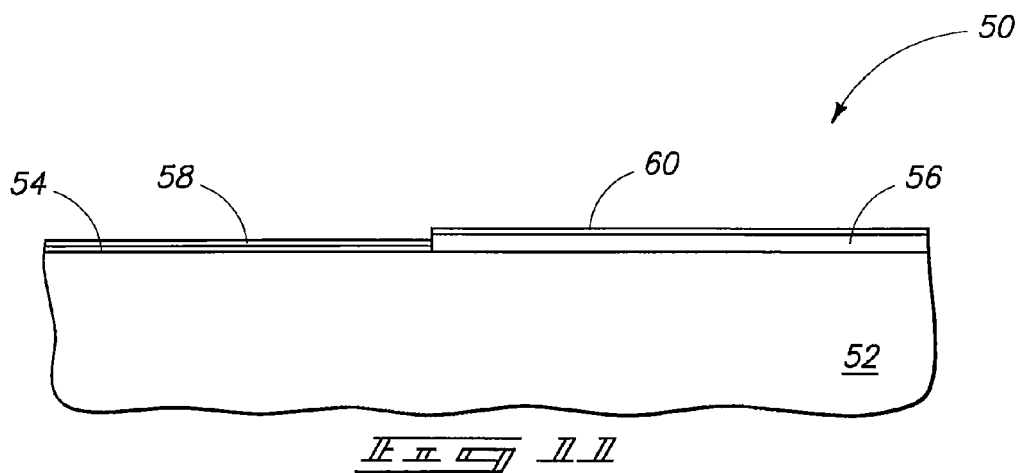
Figure 12:
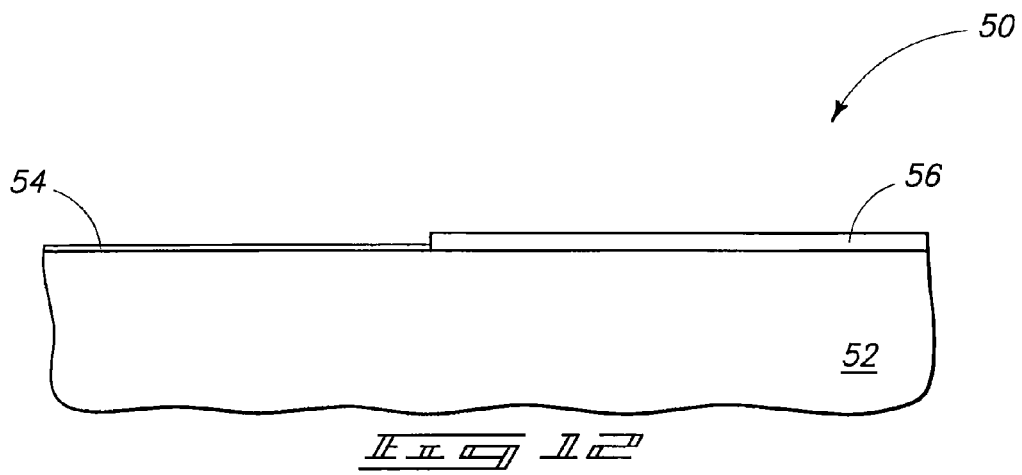

As discussed above, one of the problems with prior art methods for diffusion-limited removal of silicon dioxide is that such methods may have poor selectivity between undoped silicon dioxide and doped silicon dioxide. For purposes of interpreting this disclosure, undoped silicon dioxide means silicon dioxide and having less than 0.01 weight-percent (weight %) dopant; and doped silicon dioxide means silicon dioxide and having greater than or equal to 0.1 weight % dopant. FIGS. 10-12 illustrate an embodiment for improving selectivity of removal of undoped silicon dioxide relative to doped silicon dioxide.

Referring to FIG. 10, a portion of a semiconductor construction 50 is illustrated. The construction includes a semiconductor substrate (or base) 52, and a pair of silicon dioxide-containing materials 54 and 56 over the substrate 52.

The semiconductor substrate 52 may comprise the same compositions discussed above for the substrate 12 of FIG. 1.

The silicon dioxide-containing material 54 may be undoped silicon dioxide, and the silicon dioxide-containing material 56 may doped silicon dioxide. The doped silicon dioxide may correspond to, for example, borophosphosilicate glass, phosphosilicate glass, fluorosilicate glass, etc. Accordingly, the doped silicon dioxide may contain at least 0.1 weight %, each, of one or more of phosphorus, boron and fluorine. Although materials 54 and 56 are shown one next to another, other combinations of such materials are contemplated.

FIG. 10 shows materials 54 and 56 exposed to an etchant mixture containing $NH_xF_y$, H*, and "D", where "x" and "y" are integers greater than or equal to 1, H* is an activated form of hydrogen, and "D" is an additive to enhance selectivity. The etchant mixture may be in any suitable phase, and may, for example, be in a gaseous phase.

The additive "D" may comprise thallium, and may be present in the form $TIX_n$, where "X" is a halide and "n" is an integer greater than or equal to 2. For instance, the thallium may be present as thallium chloride. If the additive "D" comprises thallium, the thallium may be present in the etchant mixture to a concentration of from about 1 weight % to about 10 weight %. In addition to thallium, or alternatively to thallium, the additive "D" may comprise one or both of a phosphorus-containing composition and a boron-containing composition. For instance, the additive may comprise one or both of $PX_3$ and $BQ_3$; where "X" and "Q" are halides that may be the same as one another or different from one another. If the additive comprises phosphorus, such may be present to a concentration of from about 0.1 weight % to about 3 weight %; and if the additive comprises boron such may be present to a concentration of from about 0.1 weight % to about 3 weight %. In addition to, or alternatively to, one or more of thallium, phosphorus and boron, the additive "D" may comprise one or more carbon-containing compositions (i.e., organic compositions) such as one or more alkenes (for instance propylene and/or ethylene). The carbon may be present to a concentration of from about 0.1 weight % to about 3 weight %.

The addition of the additive changes a rate at which a diffusion barrier (i.e., the fluorosilicate) is formed over the doped silicon dioxide relative to the undoped silicon dioxide. There is often a minor variation in the rate at which the fluorosilicate is formed over doped silicon dioxide relative to undoped silicon dioxide even utilizing prior art methods, in that the doped silicon dioxide will etch a little slower than the undoped silicon dioxide. The introduction of one or more of the above-discussed additives "D" to the etchant mixture enhances the etch rate difference between the undoped silicon dioxide and the doped silicon dioxide so that much less of the doped silicon dioxide is removed relative to the undoped silicon dioxide.

Although the etchant mixture of FIG. 10 is shown to contain ammonium fluoride ($NH_xF_y$), in other embodiments the etchant mixture may comprise a different ammonium halide in addition to, or alternatively to, ammonium fluoride. Also, in some embodiments the methodology of FIG. 4-6, or 7-9, may be combined with that of FIGS. 10-12, and accordingly the ammonium fluoride of FIG. 10 may be replaced with the $NH_aR_bF_c$ discussed above (or with a material having the general formula $NH_aR_bX_c$, where "X" is a halide).

FIG. 11 shows construction 50 at a processing stage subsequent to that of FIG. 10, and shows undoped silicon dioxide 54 selectively etched relative to doped silicon dioxide 56. FIG. 11 also shows fluorosilicate materials 58 and 60 formed over the undoped silicon dioxide 54 and the doped silicon dioxide 56, respectively. The fluorosilicate materials 58 and 60 may have the same composition as one another, or may vary in composition from one another due to fluorosilicate 60 being formed over doped silicon dioxide while fluorosilicate 58 is formed over undoped silicon dioxide.

The fluorosilicates 58 and 60 may be removed by one or both of a thermal treatment and etching to form the structure shown in FIG. 12.

The embodiment of FIGS. 10-12 enhances selectivity for undoped silicon dioxide relative to doped silicon dioxide by providing various additives within an etchant. Another method for enhancing the selectivity is to provide additive to the doped silicon dioxide, as discussed with reference to FIGS. 13-15.

Figure 13:
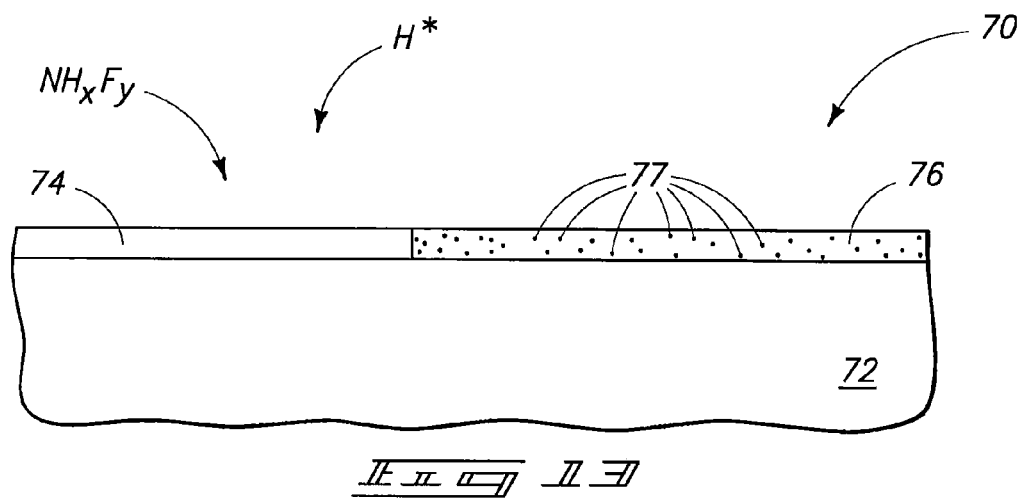
FIGS. 13-15 are diagrammatic, cross-sectional views of a portion of a semiconductor construction shown at various process stages of an embodiment.

FIG. 13 shows a portion of a semiconductor construction 70. The construction includes a semiconductor substrate (or base) 72, and a pair of silicon dioxide-containing materials 74 and 76 over the substrate 72. Although materials 74 and 76 are shown one next to another, other combinations of such materials are contemplated.

The semiconductor substrate 72 may comprise the same compositions discussed above for the substrate 12 of FIG. 1.

The silicon dioxide-containing material 74 is undoped silicon dioxide, and the silicon dioxide-containing material 76 is doped silicon dioxide. The doped silicon dioxide may correspond to, for example, borophosphosilicate glass, phosphosilicate glass, fluorosilicate glass, etc. Accordingly, the doped silicon dioxide may contain at least 0.1 weight %, each, of one or more of phosphorus, boron and fluorine. In some embodiments, any of the phosphorus, boron and fluorine present in the doped silicon dioxide is present to a concentration of less than or equal to about 5 weight %.

In addition to the phosphorus, boron and/or fluorine, the doped silicon dioxide also contains an additive indicated by stippling 77 (only some of which is labeled). Such additive corresponds to thallium, and the thallium may be present to from about 1 weight % to about 10 weight %. The thallium may be provided as a thallium halide, such as, for example, thallium chloride.

Materials 74 and 76 are exposed to an etchant mixture containing $NH_xF_y$ and H*, where "x" and "y" are integers greater than or equal to 1, and H* is an activated form of hydrogen. The etchant mixture may be in any suitable phase, and may, for example, be in a gaseous phase.

Although the etchant mixture of FIG. 13 is shown to contain ammonium fluoride ($NH_xF_y$), in other embodiments the etchant mixture may comprise a different ammonium halide in addition to, or alternatively to, ammonium fluoride. Also, in some embodiments the methodology of FIG. 4-6, or 7-9, may be combined with that of FIGS. 13-15, and accordingly the ammonium fluoride of FIG. 13 may be replaced with the $NH_aR_bF_c$ discussed above (or with a material having the general formula $NH_aR_bX_c$, where "X" is a halide).

Figure 14:
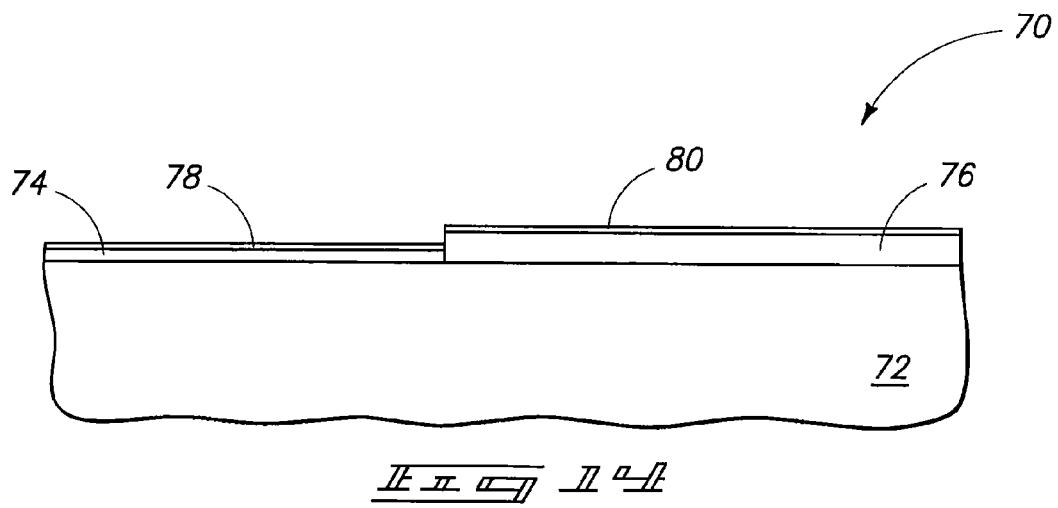

FIG. 14 shows construction 70 at a processing stage subsequent to that of FIG. 13, and shows undoped silicon dioxide 74 selectively etched relative to doped silicon dioxide 76. FIG. 14 also shows a fluorosilicate materials 78 and 80 formed over the undoped silicon dioxide 74 and the doped silicon dioxide 76, respectively. The fluorosilicate materials 78 and 80 may have the same composition as one another, or may vary in composition from one another due to fluorosilicate 80 being formed over doped silicon dioxide while fluorosilicate 78 is formed over undoped silicon dioxide.

Figure 15:
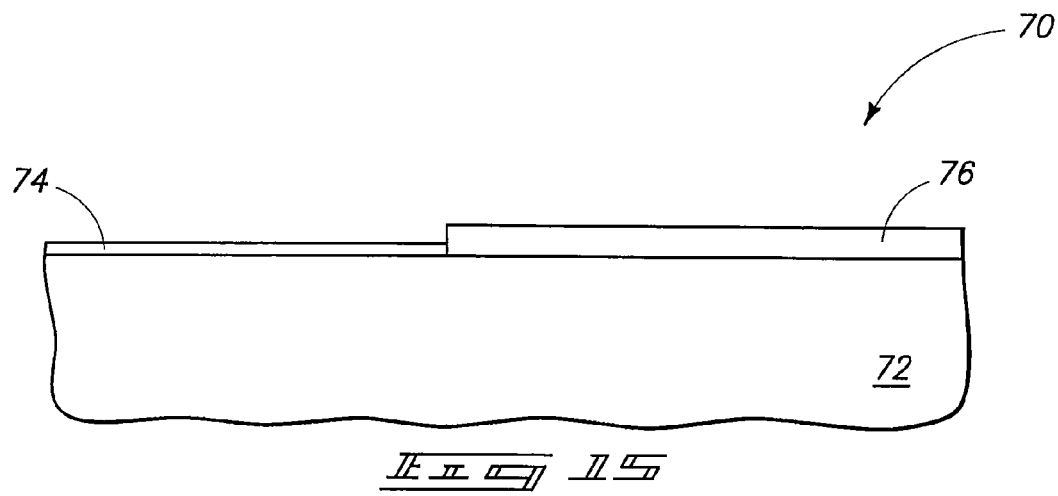

The fluorosilicates 78 and 80 may be removed by one or both of a thermal treatment and etching to form the structure shown in FIG. 15.

In some embodiments, the method of FIGS. 10-12 may be combined with that of FIGS. 13-15 so that additive 77 (FIG. 13) is incorporated into the doped silicon dioxide, and additive "D" (FIG. 10) is incorporated into the etchant.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:
1. A semiconductor construction comprising:
a semiconductor substrate;
a pair of silicon-dioxide materials over the semiconductor substrate and directly laterally adjacent one another, each of the pair of silicon-dioxide materials being in direct physical contact with the semiconductor substrate; one of the silicon dioxide-containing materials being undoped and the other of the silicon dioxide-containing materials containing silicon dioxide and thallium; and
wherein the pair of laterally adjacent silicon dioxide materials are retained in the final semiconductor construction.

2. The semiconductor construction of claim 1 wherein said other of the silicon dioxide-containing materials contains one or more of phosphorus, boron and fluorine.

3. A semiconductor construction comprising:
a semiconductor substrate;
a pair of silicon-dioxide materials over the semiconductor substrate and directly laterally adjacent one another, each of the pair of silicon-dioxide materials being in direct physical contact with the semiconductor substrate; one of the silicon dioxide-containing materials being undoped and the other of the silicon dioxide-containing materials containing silicon dioxide, thallium and phosphorus; and
wherein the pair of laterally adjacent silicon dioxide materials are retained in the final semiconductor construction.

4. The semiconductor construction of claim 3 wherein said other of the silicon dioxide-containing materials contains boron.

5. The semiconductor construction of claim 3 wherein said other of the silicon dioxide-containing materials contains fluorine.

6. A semiconductor construction comprising:
a semiconductor substrate;
a pair of silicon-dioxide materials over the semiconductor substrate and directly laterally adjacent one another, each of the pair of silicon-dioxide materials being in direct physical contact with the semiconductor substrate; one of the silicon dioxide-containing materials being undoped and the other of the silicon dioxide-containing materials containing silicon dioxide, thallium and boron; and
wherein the pair of laterally adjacent silicon dioxide materials are retained in the final semiconductor construction.

7. A semiconductor construction comprising:
a semiconductor substrate; and
a pair of silicon-dioxide materials over the semiconductor substrate and directly laterally adjacent one another, each of the pair of silicon-dioxide materials being in direct physical contact with the semiconductor substrate; one of the silicon dioxide-containing materials being undoped and the other of the silicon dioxide-containing materials containing silicon dioxide, thallium and fluorine; and
wherein the pair of laterally adjacent silicon dioxide materials are retained in the final semiconductor construction.

* * * * *

UNITED STATES PATENT AND TRADEMARK OFFICE
CERTIFICATE OF CORRECTION

| | |
|---|---|
| PATENT NO. | : 8,871,120 B2 |
| APPLICATION NO. | : 14/046832 |
| DATED | : October 28, 2014 |
| INVENTOR(S) | : Nishant Sinha |

Page 1 of 1

It is certified that error appears in the above-identified patent and that said Letters Patent is hereby corrected as shown below:

On the Title page, in item (54), and in the Specification, in column 1, lines 1-3, under "Title", delete "COMPOSITIONS OF MATTER, AND METHODS OF REMOVING SILICON DIOXIDE" and insert -- SEMICONDUCTOR CONSTRUCTIONS --, therefor.

Signed and Sealed this
Thirtieth Day of December, 2014

Michelle K. Lee
*Deputy Director of the United States Patent and Trademark Office*